United States Patent
Lin

(10) Patent No.: US 6,321,452 B1
(45) Date of Patent: Nov. 27, 2001

(54) METHOD FOR MANUFACTURING THE HEAT PIPE INTEGRATED INTO THE HEAT SINK

(76) Inventor: Liken Lin, 35, Chung Yang Road, Section 4, Tu-Cheng, Taipei Hsien (TW)

(*) Notice: Subject to any disclaimer, the term of this patent is extended or adjusted under 35 U.S.C. 154(b) by 0 days.

(21) Appl. No.: 09/531,558

(22) Filed: Mar. 20, 2000

(51) Int. Cl.⁷ .................................................. B23P 15/26
(52) U.S. Cl. ............................... 29/890.032; 29/890.03
(58) Field of Search ....................... 29/890.03, 890.035, 29/890.032; 165/80.3; 164/34

(56) References Cited

U.S. PATENT DOCUMENTS 4,285,285 * 8/1981 Hayashi et al. ........................ 164/34
5,960,866 * 10/1999 Kimura et al. ..................... 29/890.03
5,983,995 * 11/1999 Shutou et al. ....................... 165/80.3
6,189,213 * 2/2001 Kimura et al. ..................... 29/890.03

* cited by examiner

Primary Examiner—I Cuda Rosenbaum
(74) Attorney, Agent, or Firm—Jacobson Holman, PLLC

(57) ABSTRACT

A method of manufacturing a heat pipe integrated into a heat sink. A pipe-shaped groove is mounted into the mold of the heat sink. The heat pipe is shaped into a form fitting into the groove and mounted into the groove. The heat sink is formed by compression casting and the heat pipe is integrated into the heat sink. The heat pipe has at least one open end exposed to the lateral side of the heat sink. Heat conductive liquid is filled into the heat pipe through the above open end which is sealed by tin afterwards. According to the foregoing method, the heat pipe is formed integrally in the heat sink so that the separation of the heat pipe can be avoided and the efficiency of heat dissipation is also improved.

3 Claims, 6 Drawing Sheets

METHOD FOR MANUFACTURING THE HEAT PIPE INTEGRATED INTO THE HEAT SINK

BACKGROUND OF THE INVENTION

1. Field of the Invention

The present invention relates to methods of manufacturing a heat pipe integrated into the heat sink, and more particularly, to a method of manufacturing a heat pipe integrated into the heat sink produced by compression casting for avoiding the separation of the heat pipe and improving the efficiency of heat dissipation.

2. Description of the Prior Art

A CPU on the motherboard is the most important component in a computer. When the CPU is operated, a lot of heat is generated and must be quickly carried away, otherwise, the CPU will be out of order due to overheating. The conventional heat dissipating devices are commonly composed of a heat sink having a radiator fan mounted on the CPU. The heat is transmitted from the heat sink to the radiator fan and the air passing produces a cool airflow, whereby the heat is quickly and effectively dissipated due to forced convection by a fan.

The heat sink mounted on the CPU is composed of metal with high conductivity but the dissipating efficiency is limited, and is especially insufficient for notebooks. Therefore, a heat pipe is filled with heat conductive liquid and is mounted on the heat sink to carry away the heat more quickly and effectively.

The conventional heat sink with pipes, as shown in FIG. 5 and FIG. 6, has a groove (a1) for accommodating heat pipe (b) on the heat sink (a). The heat pipe (b) is curved to the same arc of the groove (a1) and then fitted onto the groove (a1) with heat conductive adhesive (c). The heat pipe (b) has been filled with heat conductive liquid in advance.

Yet the heat conductive adhesive (c) for fixing the heat pipe (b) into the groove (a1) of the heat sink (a) forms a layer of another substance between heat pipe (b) and the heat sink (a) so that the heat-radiating rate is decreased and the efficiency of heat dissipation is also reduced.

Once the heat conductive adhesive (c) absorbs heat, it easily hardens and causes the separation of the heat pipe (b). The heat pipe (b) cannot be in contact with the heat sink (a) very closely and the heat-radiating rate is lower. By the way, due to the use of heat conductive adhesive (c), difficulties in assembling the heat sink and cost of the production are increased.

Furthermore, only half of the circumference of the section of the heat pipe (b) is connected to the heat sink (a) thus the contact area between the heat pipe (b) and the heat sink (a) is only half of the total surface area of the heat pipe (b). Since the contact area for heat-dissipating is decreased, the efficiency of heat dissipation is also reduced.

In addition, when the heat pipe (b) is shaped and bent with the same curve of the groove (a1) of the heat sink (a), the tolerance is difficult to avoid when being assembled. Thus, the heat pipe (b) cannot contact the groove (a1) of heat sink (a) very closely. This further increases the difficulty of assembling the heat sink. Also, the bending point of the heat pipe (b) has a stress concentrated phenomenon and tends to break when the heat conductive liquid inside the heat pipe (b) absorbs heat and expands. The leakage of the heat conductive liquid will also reduce the efficiency of heat dissipation.

SUMMARY OF THE INVENTION

It is a primary object of the present invention to solve the problems of the separation of the heat pipe and improve the efficiency of heat dissipation by providing a heat sink with heat pipe which is formed integrally therein. It is another object of this invention to provide a heat pipe formed integrally inside the heat sink for easily assembling and cost down.

According to the above object, the present invention is a method of manufacturing the heat pipe by integration of the heat pipe into the heat sink. A pipe-shaped groove is mounted into the mold of the heat sink. The heat pipe is shaped into the same form of the groove and mounted into the groove. Next, the heat sink is formed by compression casting and the heat pipe is integrated into the heat sink. The heat pipe has at least one open end exposed to the lateral side of the heat sink. Heat conductive liquid is filled into the heat pipe through the open end which is sealed by tin afterwards. According to the foregoing method, the heat pipe is formed integrally in the heat sink so that the separation of the heat pipe can be avoided and the efficiency of heat dissipation is also improved. The production of the heat sink is more convenient and the cost is also reduced.

The present invention can be best understood through the following description and accompanying drawings, wherein:

DETAILED DESCRIPTION OF THE PREFERRED EMBODIMENT

Figure 1:
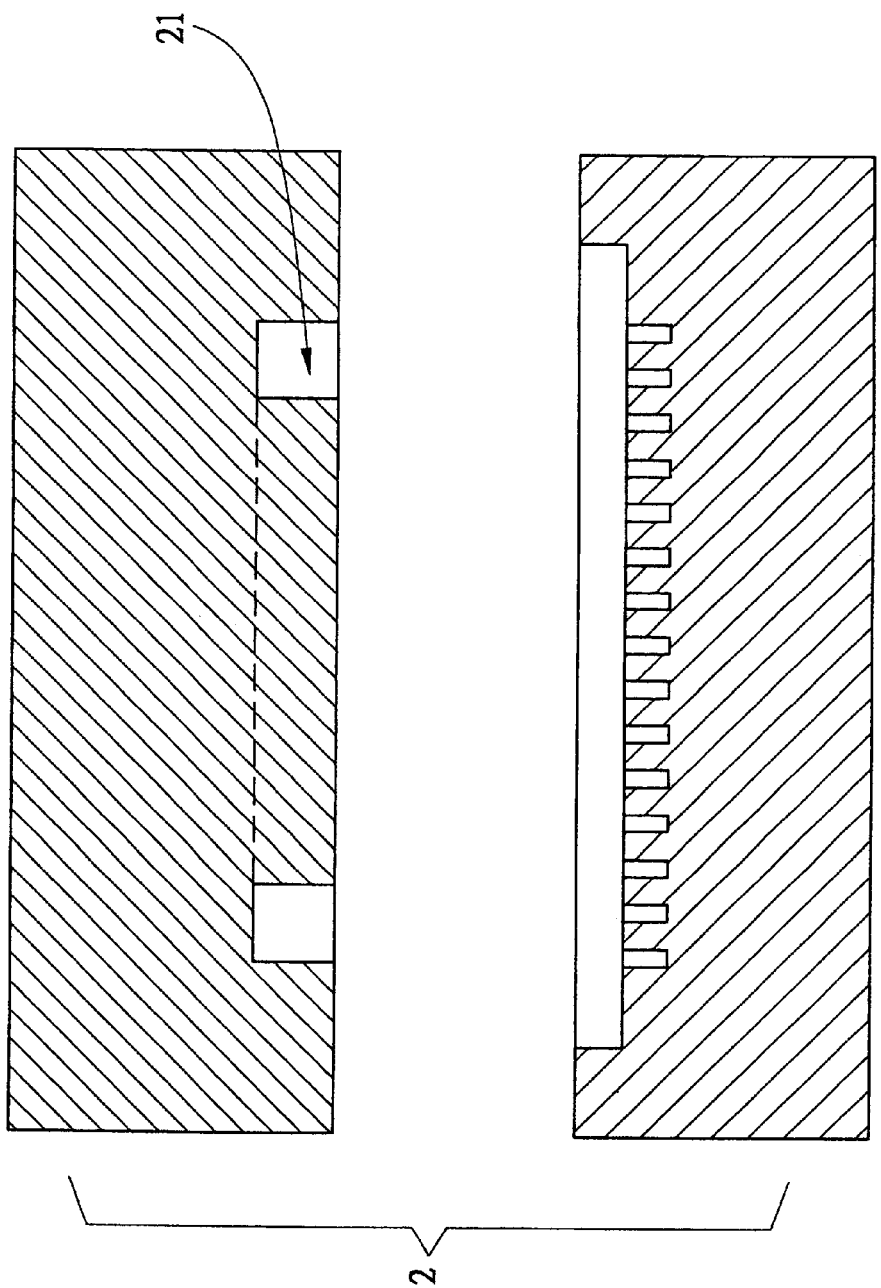
FIG. 1 is a cross-sectional view of the mould of the present invention.
Figure 2:
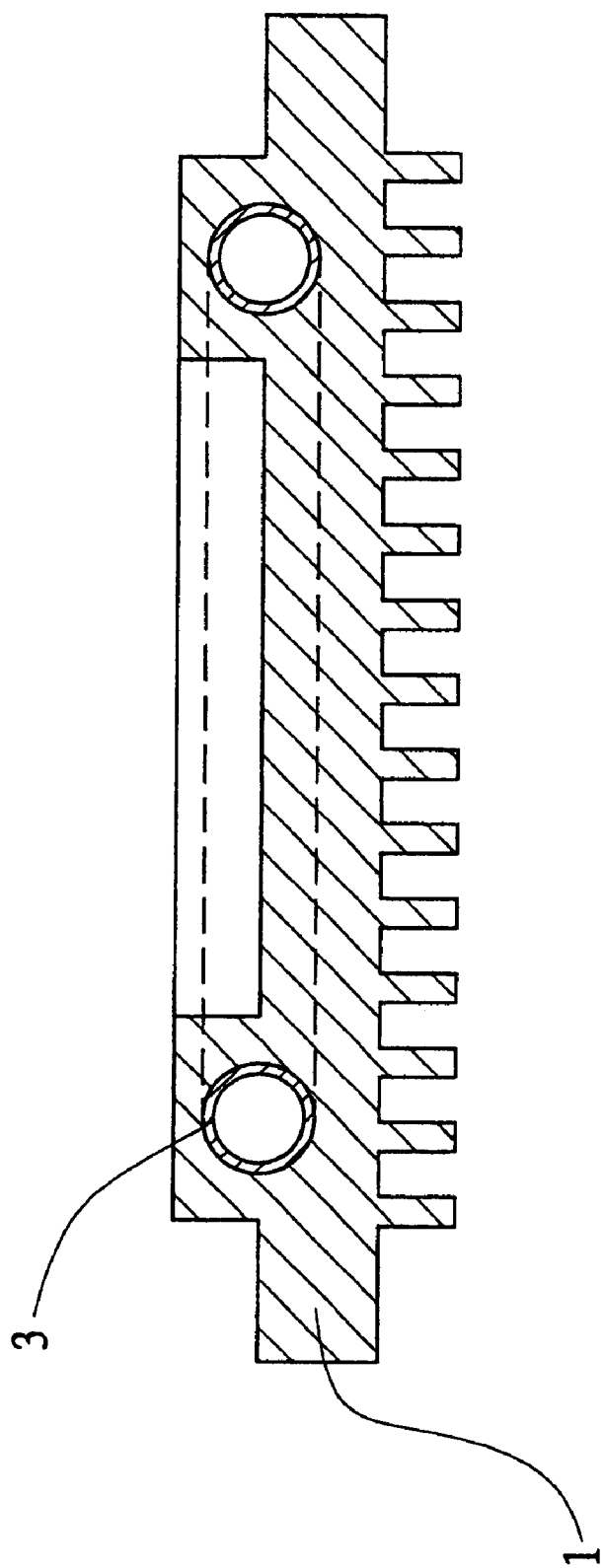
FIG. 2 is a cross-sectional view of the heat sink of the present invention.
Figure 3:
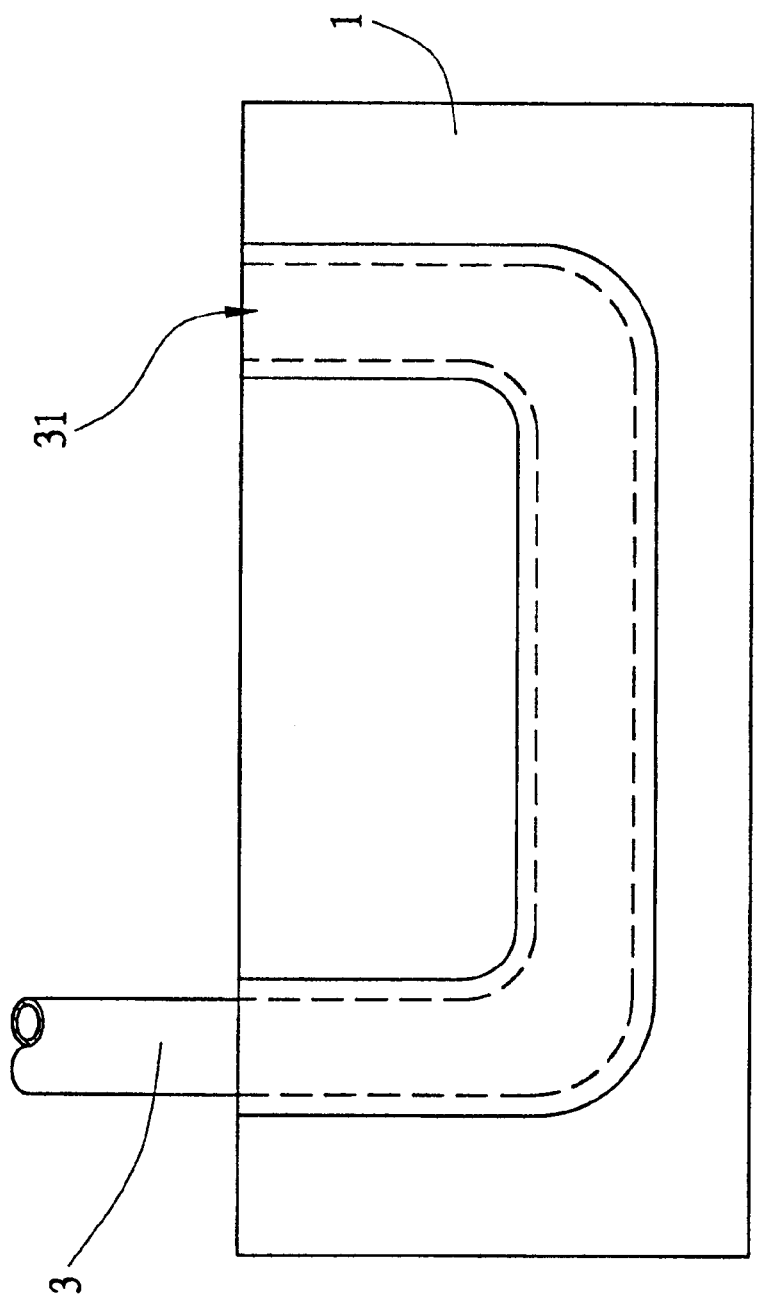
FIG. 3 is a top view of the heat sink of the present invention.
Figure 4:
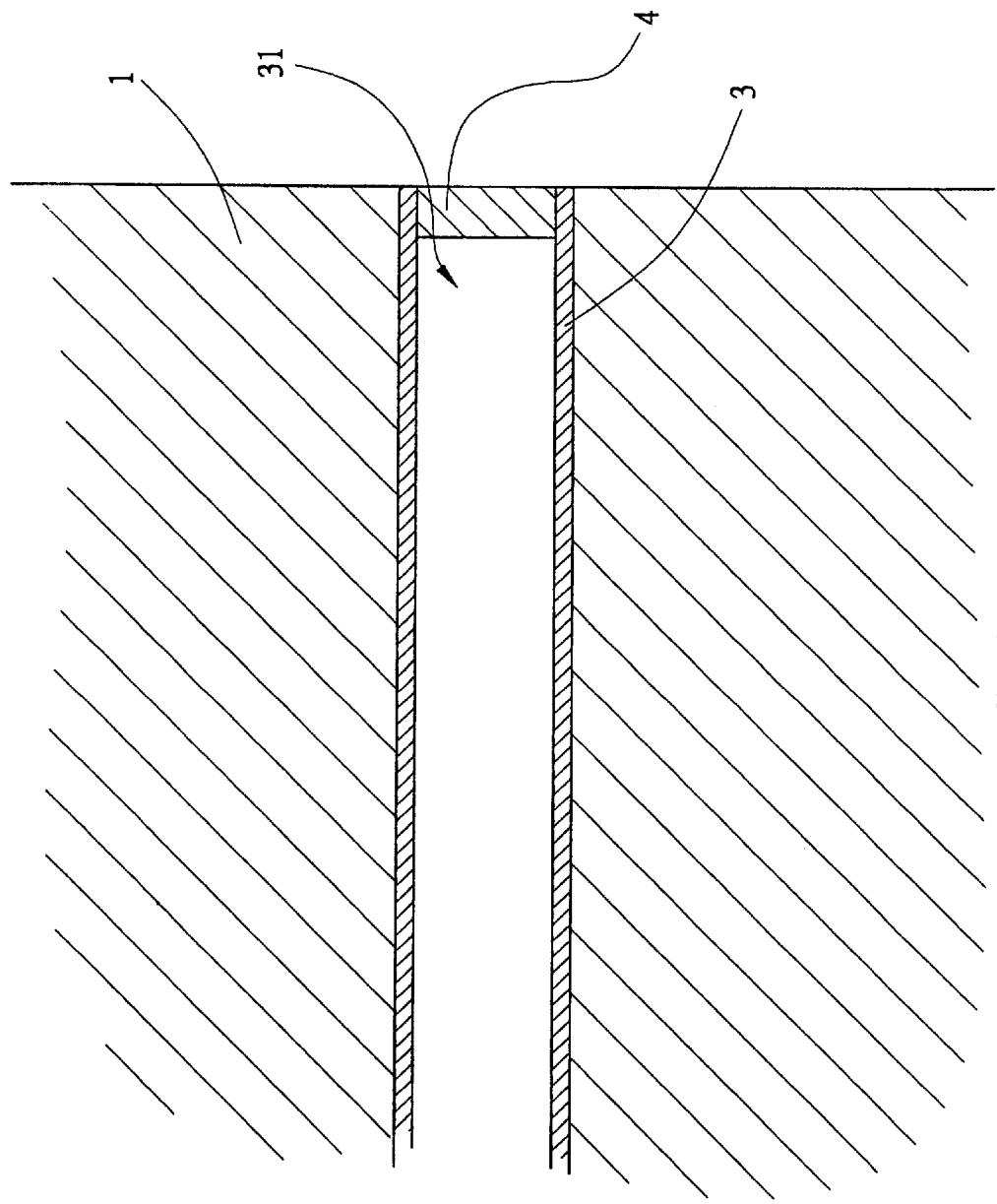
FIG. 4 is a partial cross-sectional view of the present invention.
Figure 5:
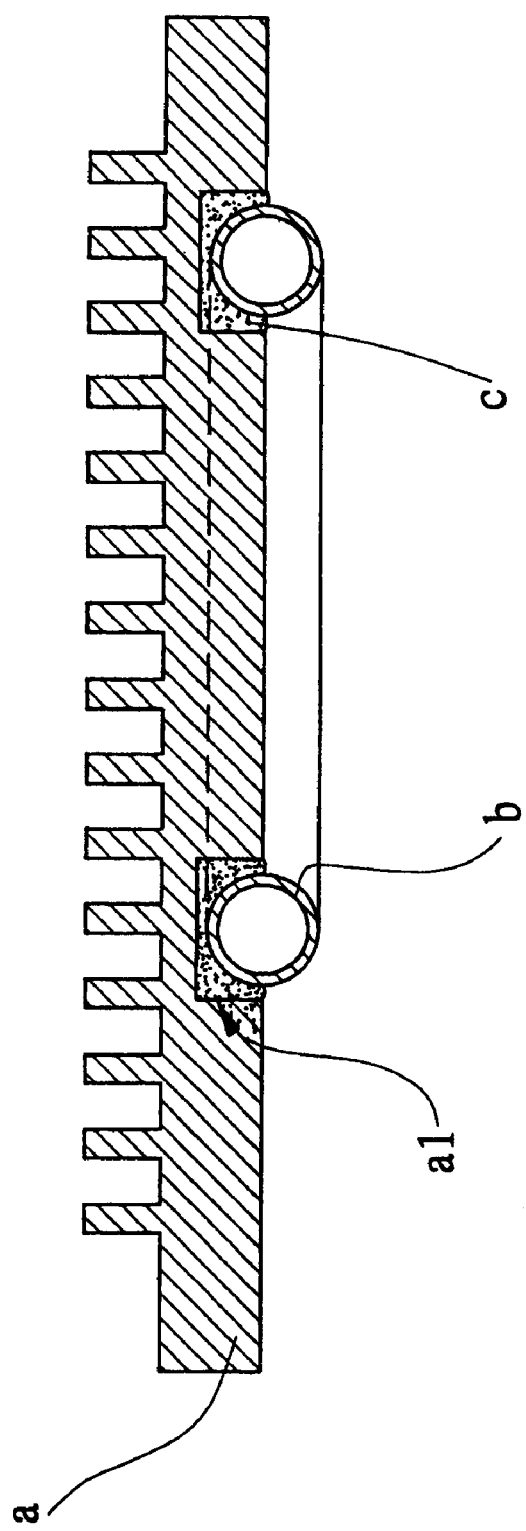
FIG. 5 is a cross-sectional view of the conventional heat sink.
Figure 6:
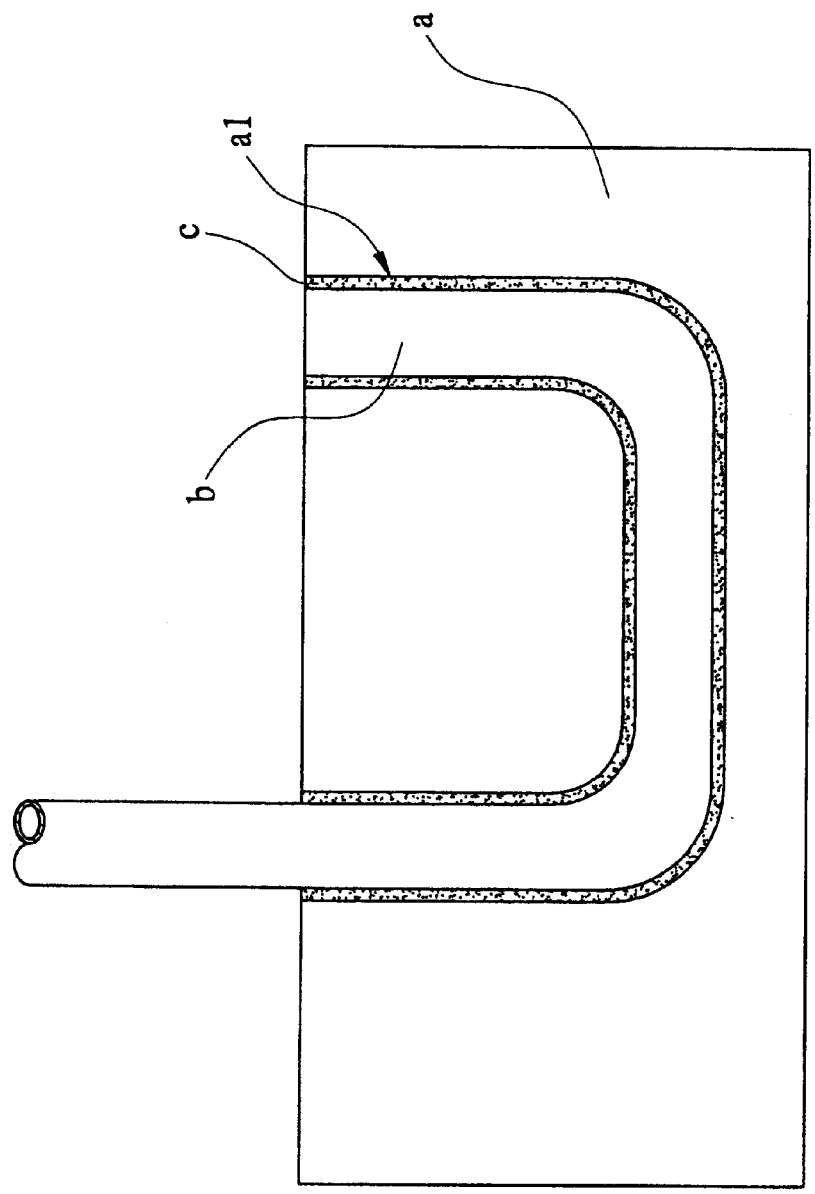
FIG. 6 is a top view of the conventional heat sink.

First, referring to FIGS. 1–3. The present method comprises the following steps:

(a) Adding a groove 21 with bent-pipe shape to the mold 2 of the heat sink 1;

(b) Bending the heat pipe 3 into the same shape of the groove 21 of the mold 2;

(c) Fitting the heat pipe 3 into the groove 21 of the mold 2;

(d) Forming the heat sink 1 by compression casting and the heat pipe 3 is integrally formed in the heat sink 1 with at least one open and 31 exposed to the lateral side of the heat sink 1;

(e) Filling the heat conductive liquid into the heat pipe 3 through the open end 31; and (f) Sealing the open end 31 of the heat pipe 3 with tin 4, as shown in FIG. 4.

According to the above-mentioned manufacturing process, the heat pipe 3 is mounted into the groove 21 of the mold 2 and then formed integrally with the heat sink 1. Thus the inconvenience and difficulty of assembling process are avoided.

Furthermore, heat pipe 3 is formed in the heat sink 1 so that the whole circumference of the section of the heat pipe 3 can fully contact with the heat sink 1 and increase the contact area of heat dissipation and the heat-dissipating efficiency of the heat sink 1 is also improved.

In addition, the heat conductive adhesive is not necessary because the heat pipe 3 is formed integrally in the heat sink 1 and contacts with the heat sink 1 directly for heat dissipation without any other substance for adhesion. Therefore, the conventional separation of heat pipe 3 due to the hardening of the adhesive glue can be avoided. As the heat pipe 3 is bent in advance and forms in the heat sink 1 afterwards, the stress concentration phenomenon of the heat pipe 3 can also be eliminated and the possibility of breakage of the heat pipe 3 through the expanding of the heat conductive liquid is reduced. Accordingly, the leakage of the heat conductive liquid can also be warded off.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a heat pipe integrated into a heat sink, comprising the steps of:

adding a groove with a bent-pipe shape to a mold of the heat sink;

bending the heat pipe into the same shape of said groove of said mold;

fitting a copper pipe into said groove of said mold;

forming said heat sink by compression casting and said heat pipe is integrally formed in said heat sink with at least one open end exposed to a lateral side of said heat sink;

filling a heat conductive liquid into said heat pipe through said at least one open end; and sealing said at least one open end of said heat pipe with tin.

2. The method of manufacturing the heat pipe integrated into the heat sink as recited in claim 1, wherein the heat pipe contacts the heat sink.

3. The method of manufacturing the heat pipe integrated into the heat sink as recited in claim 2 wherein said contact is for heat dissipation.

* * * * *